United States Patent
Kim et al.

[11] Patent Number: 5,939,954
[45] Date of Patent: Aug. 17, 1999

[54] EQUIVALENT CIRCUIT OF PACKAGE GROUND TERMINAL PADDLE

[75] Inventors: Min Gun Kim; Choong Hwan Kim; Chang Seok Lee; Jae Jin Lee; Kwang Eui Pyun, all of Daejon, Rep. of Korea

[73] Assignee: Electronics and Telecommunications Research Institute, Taejon-shi, Rep. of Korea

[21] Appl. No.: 08/955,378

[22] Filed: Oct. 21, 1997

[30] Foreign Application Priority Data

Oct. 23, 1996 [KR] Rep. of Korea .................. 1996-47659

[51] Int. Cl.⁶ .............................. H03H 7/38; H01L 23/64; H05K 7/02
[52] U.S. Cl. ........................... 333/32; 333/247; 174/52.1; 257/728; 361/808
[58] Field of Search ........................ 333/247, 32; 174/51, 174/52.1; 257/728, 731; 361/807, 808

[56] References Cited

U.S. PATENT DOCUMENTS

| | | | |
|---|---|---|---|
| 5,089,878 | 2/1992 | Lee | 257/728 X |
| 5,257,411 | 10/1993 | Minasi | 333/247 X |
| 5,430,418 | 7/1995 | Blodgett | 333/124 X |
| 5,504,423 | 4/1996 | Fang | 324/158.1 |
| 5,691,673 | 11/1997 | Ishikawa | 333/247 X |

*Primary Examiner*—Robert Pascal
*Assistant Examiner*—Barbara Summons
*Attorney, Agent, or Firm*—Cohen, Pontani, Lieberman & Pavane

[57] ABSTRACT

The present invention relates to an equivalent circuit of a package ground terminal paddle which is used to mount a microwave integrated circuit, and more particularly, to an approximate equivalent circuit of the package ground terminal paddle by which the expressions of parasitic components can be easily expanded according to the number of gold wires that are down-bonded to the paddle, by introducing an equivalent circuit structure which takes the impedance component output from each terminal as one common impedance component and grounds the common impedance.

4 Claims, 6 Drawing Sheets

EQUIVALENT CIRCUIT OF PACKAGE GROUND TERMINAL PADDLE

FIELD OF THE INVENTION

The present invention relates to an approximate equivalent circuit of a package ground terminal paddle, and more particularly, to an approximate equivalent circuit of the package ground terminal paddle which can be easily expanded through a meaningful approximation according to the number of the gold wire that is down-bonded to the paddle.

BACKGROUND OF THE INVENTION

When designing a circuit, considerations must be given to the fact a microwave monolithic integrated circuit is greatly affected by the properties of a package parasitic component as the frequency range thereof is relatively high. In particular, as an interference effect between the elements within the circuit which occurs through the ground terminal affects the stability and the performance of the circuit, it is important to analyze the interference effect exactly.

When representing its parasitic component using an equivalent circuit of a conventional package ground terminal paddle, an individual consideration is given to all the possible impedance components between the terminals attached to the gold wire that is down-bonded from a chip. Accordingly, if the number of gold wires to which the paddle is down-bonded is many, the equivalent circuit of the ground terminal paddle is complicated and accordingly it is difficult to find the values of all the impedance components thereof, thereby requiring much efforts and time in designing a circuit.

When the number of the gold wire which is down-bonded at package paddle is many, the impedance between each down-bonded terminal has different values according to the shape of the paddle and the distribution of the terminal. The interference effect through the down-bonded terminals, which affects the stability and the performance of the circuit is biggest between the neighboring terminals positioned farthest from a ground via hole because the magnitude of impedance between the down-bonded terminals is small and that between the down-bonded terminal and the ground via hole is large. Considering that the impedance component to cause this largest interference is seen between all the terminals, the deterioration of the performance in the chip characteristic due to the interference through the ground terminal can be avoided since the chip characteristic can be simulated in a worst environment. However, a conventional equivalent circuit has a drawback in that it is not capable of reducing its complexity because it is designed to have the impedance component among all the down-bonded terminals and the ground via ones.

SUMMARY OF THE INVENTION

Accordingly, in order to overcome the above-noted problems, the present invention has the object to provide an approximate equivalent circuit of a package ground terminal paddle, which can be easily expanded through a meaningful approximation according to the number of the gold wire that is down-bonded to the paddle, by introducing an equivalent circuit which takes the impedance component output from each terminal as one common impedance component and grounds the common impedance.

BRIEF DESCRIPTION OF THE DRAWINGS

For fuller understanding of the nature and object of the invention, reference should be had to the following detailed description taken in conjunction with the accompanying drawings in which.

Similar reference characters refer to similar parts in the several views of the drawings.

DESCRIPTION OF THE INVENTION

Below, the present invention will be explained in detail by reference to the accompanying drawings.

Figure 1:
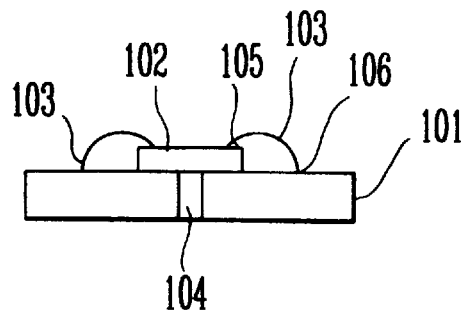
FIG. 1 is a structure for showing the bonding state of the package.

FIG. 1 is a structure for showing the bonding state of the package, in which a microwave monolithic integrated circuit 102 is die-bonded to the upper portion of the package paddle 101 that is grounded to the ground terminal hole 104, and the ground terminal 105 of the integrated circuit 102 is down-bonded to the position of the paddle ground terminal 106 with a gold wire 103.

Figure 2:
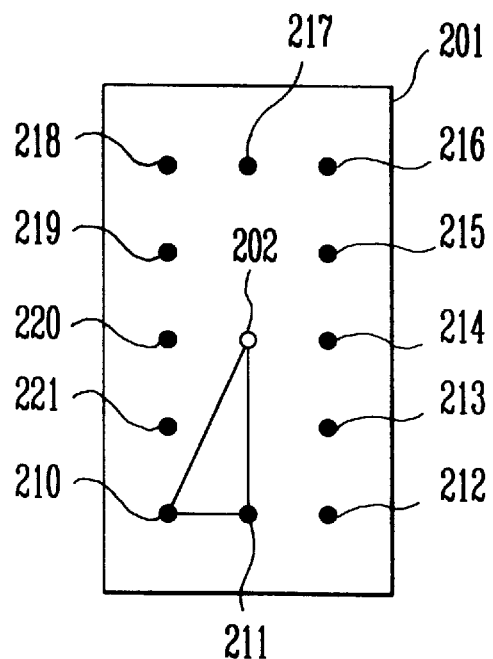
FIG. 2 is a plane view of the package ground terminal paddle.

FIG. 2 is a plane view of the package ground terminal paddle, in which there exists a ground terminal hole 202 at its center and signal terminals 210 through 221 to which gold wires are down-bonded from the chip are indicated, respectively. Considering two signal terminals 210 and 211 among the gold wires to be down-bonded, a parasitic impedance component at the two signal terminals 210 and 211 may be represent into three components; an impedance between two signal terminals 210 and 211, an impedance between the signal terminal 210 and the ground terminal hole 202, and an impedance between the signal terminal 211 and the ground terminal hole 202.

Figure 3:
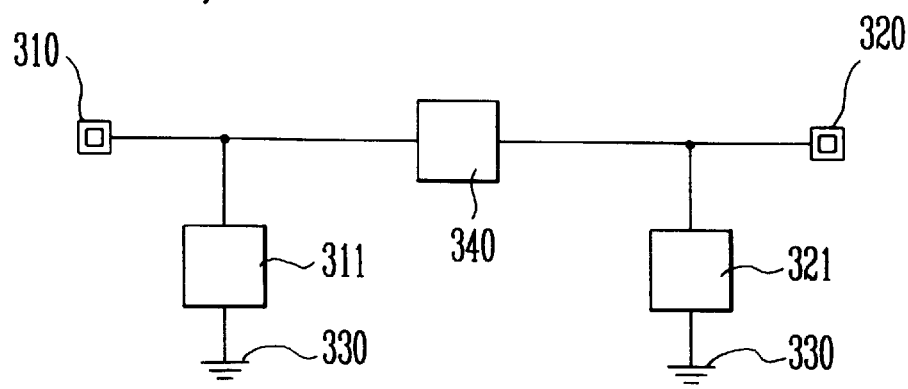
FIG. 3 shows a structure of a two-terminal equivalent circuit of a conventional package ground terminal paddle.

FIG. 3 shows a structure of a two-terminal equivalent circuit of a conventional package ground terminal paddle, which is consisted of a first impedance 340 between a first signal terminal 310 and a second signal terminal 320, a second impedance 311 between the first signal terminal 310 and a ground terminal 330, and a third impedance 321 between the second signal terminal 320 and the ground terminal 330.

Considering all of the 12 down-bonded signal terminals 210 to 221 shown in FIG. 2, the equivalent circuit as shown in FIG. 3 is consisted of 12 impedance components between each signal terminal and ground terminal, and 66 impedance components between different terminals. Generally, assuming N down-bonded positions, a parasitic component is consisted of N(N+1)/2 impedance components including N impedance components between each signal terminal and ground terminal and N(N−1)/2 impedance components between different signal terminals.

As the number of the gold wires is many and if the equivalent circuit representing the parasitic component of the paddle is complicated, as shown in the drawing, it is difficult to find all the values thereof and also it takes a lot of time and effort in designing a circuit.

In addition, as the degree of the impedance occurring between any two points over the paddle is proportional to the impedance between each signal terminal and each ground terminal and inversely proportional to the impedance between two signal terminals, the largest interference can occur between the neighboring signal terminals which are positioned farthest away from the ground terminal. Interference between the remaining signal terminals is smaller than this. In designing a microwave monolithic integrated circuit to be down-bonded by N gold wires, when being difficult to represent the package paddle as exact N(N+1)/2 impedance components, to design a circuit assuming the allowable biggest interference between all of any two signal terminals occurs, is an approximately meaningful method as assuming a worst case in which the circuit may encounter. Actually, the biggest interference occurs between four terminal pairs in FIG. 2., for example, terminal 210-211, 211-212, 216-217 and 217-218.

When consisting of an equivalent circuit in which the allowable largest interference occurs between N signal terminals using the structure for showing a two-terminal equivalent circuit of a conventional package ground terminal paddle of FIG. 3, though each impedance value is fixed, the complexity of the circuit can not be reduced because it still need N(N+1)/2 components.

Figure 4:
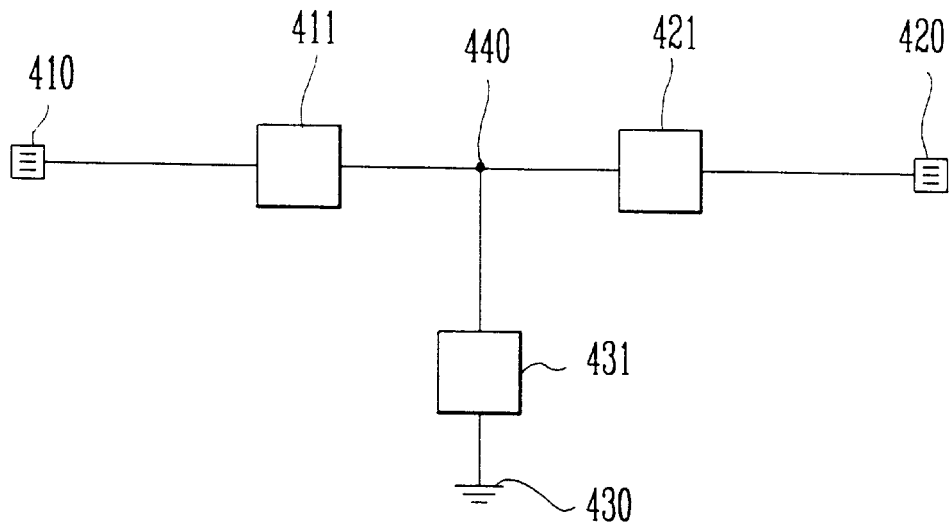
FIG. 4 shows a structure of a two-terminal equivalent circuit of a package ground terminal paddle in accordance with the present invention.

FIG. 4 shows a structure of a two-terminal equivalent circuit of a package ground terminal paddle in accordance with the present invention, in which is consisted of a first impedance 411 between a first signal terminal 410 and a node 440, a second impedance 421 between a second signal terminal 420 and the node 440, and a third impedance 431 between a ground terminal 430 and the node 440.

Figure 5:
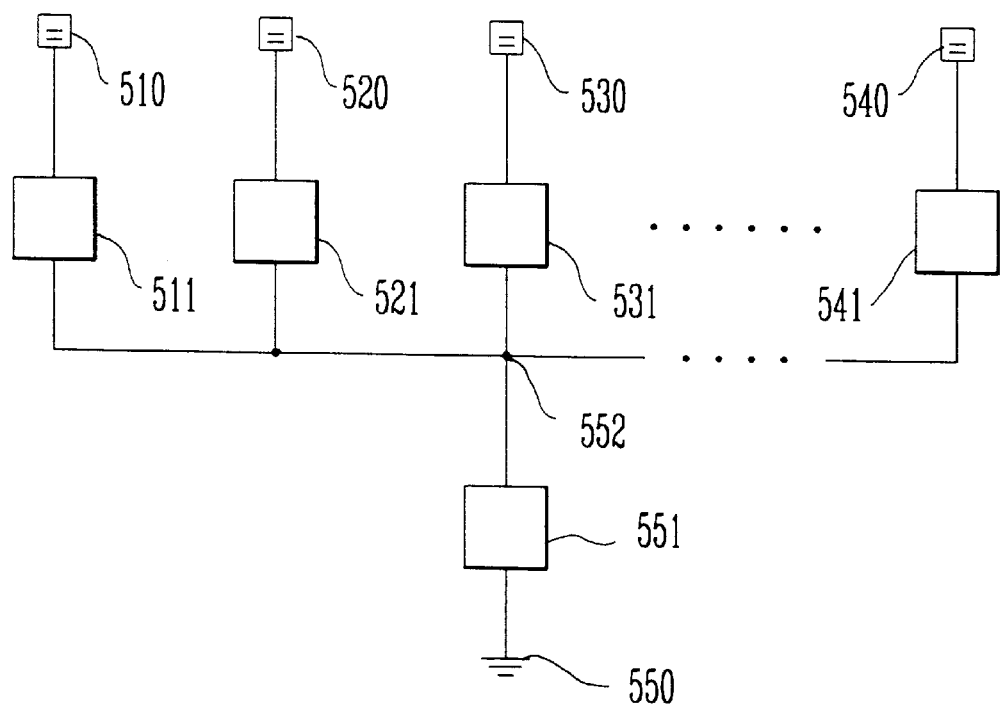
FIG. 5 shows a structure of N terminal equivalent circuits of a package ground terminal paddle in accordance with the present invention.

FIG. 5 shows a structure of N terminal equivalent circuits of a package ground terminal paddle in accordance with the present invention, which is an expanded equivalent circuit in which the allowable largest interference occurs between N terminals using a two-terminal equivalent circuit of package ground terminal paddle shown in FIG. 4. Therefore, simplified equivalent circuit can be obtained by using N+1 of impedance values which are predetermined.

The structure in FIG. 5 is consisted of a first impedance 511 between a first signal terminal 510 and a node 552, a second impedance 521 between a second signal terminal 520 and the node 552, a third impedance 531 between a third signal terminal 530 and the node 552, a Nth impedance 541 between a Nth signal terminal 540 and the node 552, and a N+1 impedance 551 between a ground terminal 550 and the node 552.

Figure 6:
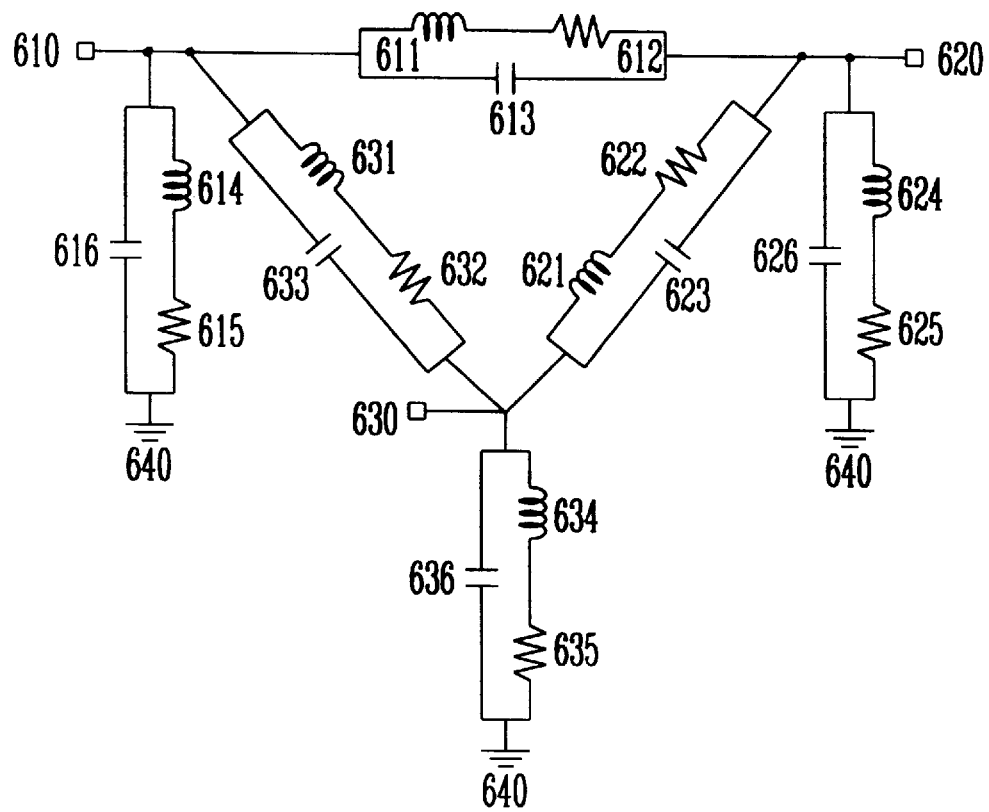
FIG. 6 shows a structure of one embodiment of a three-terminal equivalent circuit model of a conventional package ground terminal paddle.

FIG. 6 shows a structure of one embodiment of a three-terminal equivalent circuit model of a conventional package ground terminal paddle, which is consisted of an inductor 611, a resistor 612 and a capacitor 613 of a first impedance component between a first signal terminal 610 and a second signal terminal 620, an inductor 621, a resistor 622 and a capacitor 623 of a second impedance component between the second signal terminal 620 and the third signal terminal 630, an inductor 631, a resistor 632 and a capacitor 633 of a third impedance component between the third signal terminal 630 and the first signal terminal 610, an inductor 614, a resistor 615 and a capacitor 616 of a fourth impedance component between the first signal terminal 610 and a ground terminal 640, an inductor 624, a resistor 625 and a capacitor 626 of a fifth impedance component between the second signal terminal 620 and the ground terminal 640, and an inductor 634, a resistor 635 and a capacitor 636 of a sixth impedance component between the third signal terminal 630 and the ground terminal 640.

Figure 7:
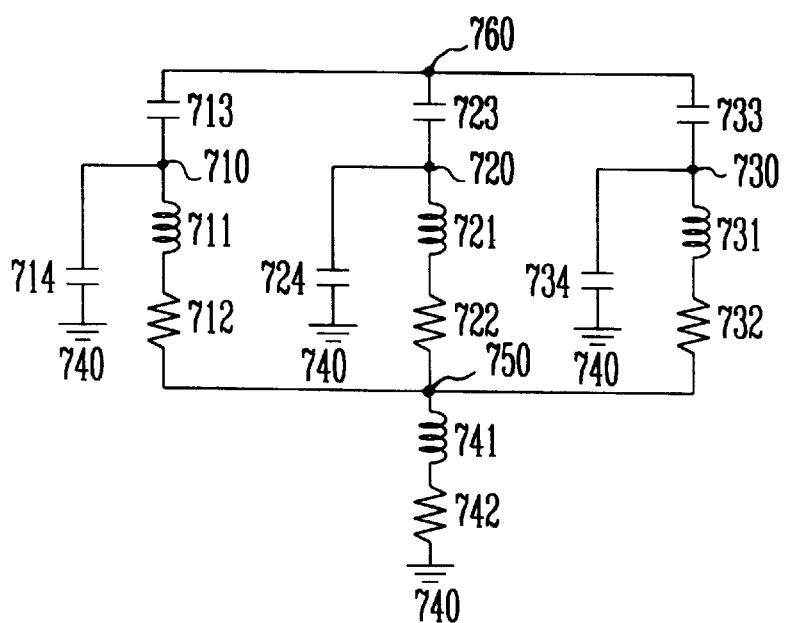
FIG. 7 shows a structure for one embodiment of three-terminal equivalent circuit model of package ground terminal paddle in accordance with the present invention.

FIG. 7 shows a structure for one embodiment of three-terminal equivalent circuit model of package ground terminal paddle in accordance with the present invention, which is consisted of an inductor 711 and a resistor 712 between a first signal terminal 710 and a node 750, an inductor 721 and a resistor 722 between a second signal terminal 720 and the node 750, an inductor 731 and a resistor 732 between a third signal terminal 730 and the node 750, a capacitor 713 between the first signal terminal 710 and a node 760, a capacitor 723 between the second signal terminal 720 and the node 760, a capacitor 733 between the third signal terminal 730 and the node 760, a capacitor 714 between the first signal terminal 710 and the ground terminal 740, a capacitor 724 between the second signal terminal 720 and the ground terminal 740, a capacitor 734 between the third signal terminal 730 and the ground terminal 740, and the inductor 741 and the resistor 742 between the ground terminal 740 and a node 750.

Figure 8A:
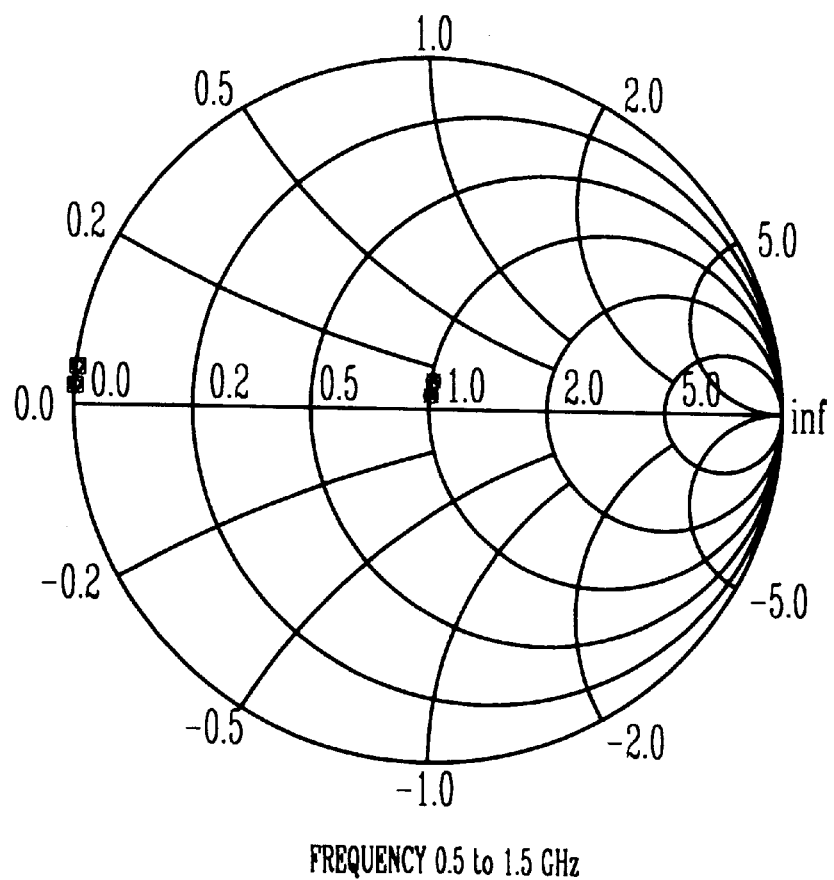
FIGS. 8A, 8B and 8C show waveforms for comparing the states of the scattering parameters in a three-terminal equivalent circuit model of a conventional package ground terminal paddle in a prior art and in the present invention.
Figure 8B:
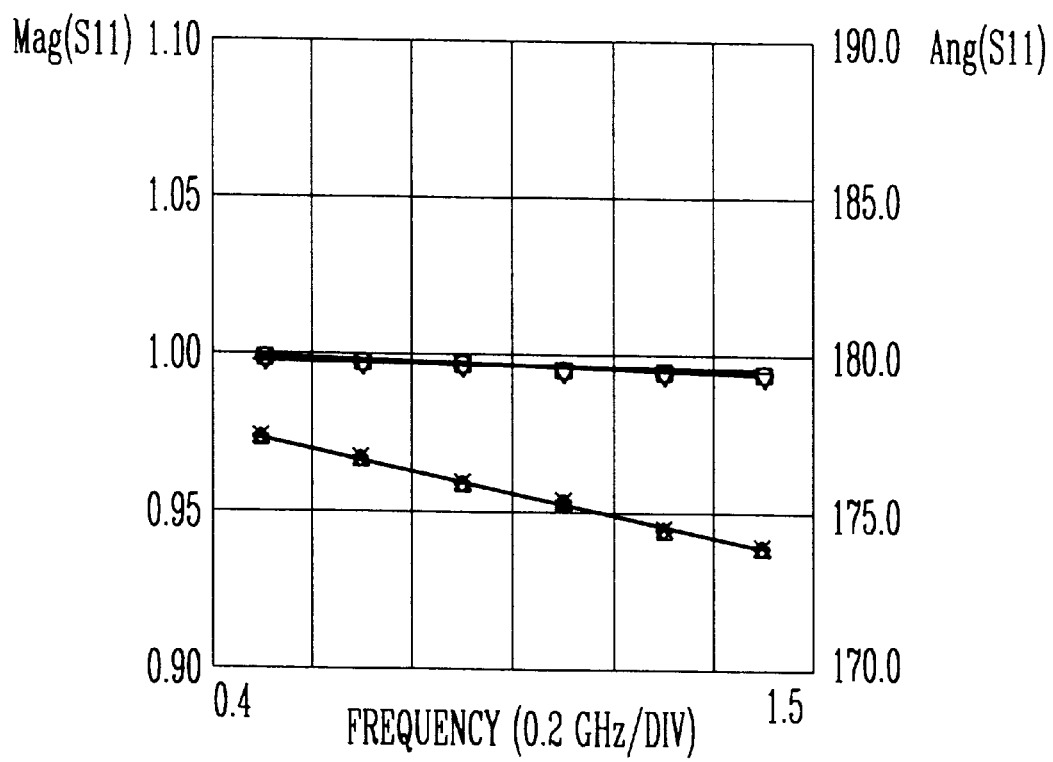
Figure 8C:
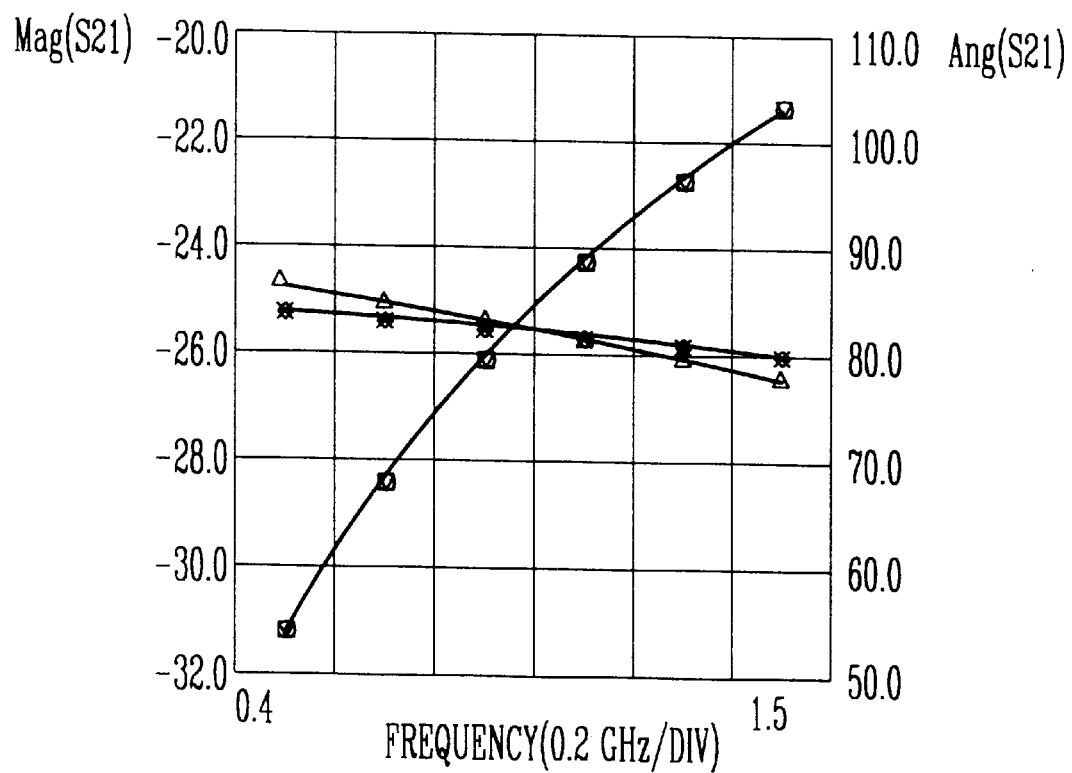

FIGS. 8A through 8C show waveforms for comparing the states of the scattering parameters in a three-terminal equivalent circuit model of a conventional package ground terminal paddle in a prior art and in the present invention, where in FIG. 8A is shown S11 of a reflection coefficient at the input terminal and S21 of a transmission coefficient from the input terminal to the output terminal on a Smith chart, to show this more statistically, in FIG. 8B is shown the magnitude and angle of S11, and in FIG. 8C is shown the magnitude and angle of S21. The scattering parameter of Bench 1 in FIGS. 8A to 8C is as a result of electromagnetic analysis into a real package ground terminal and the scattering parameter of Bench 2 thereof is as a result of representing a conventional package ground terminal paddle as a three-terminal equivalent circuit, and the scattering parameter of Bench 3 thereof is as a result of representing a package ground terminal paddle of the present invention as a three-terminal equivalent circuit. It should be noted that three results are well consistent with another.

As mentioned above, the present invention can, in designing a microwave monolithic integrated circuit, simulate more easily interference phenomena between internal elements through a package ground terminal, thereby improving the operability of designed circuit.

The foregoing description, although described in its preferred embodiment with a certain degree of particularity, is only illustrative of the principles of the present invention. It is to be understood that the present invention is not to be limited to the preferred embodiments disclosed and illustrated herein. Accordingly, all expedient variations that may be made within the scope and spirit of the present invention are to be encompassed as further embodiments of the present invention.

What we claim:

1. An equivalent circuit for representing a parasitic component of a package ground terminal paddle having a plurality of signal terminals for mounting a monolithic microwave integrated circuit, comprising:
    a plurality of inductors and resistors, in which said inductor and said resistor are serially connected with each other between said each signal terminal and a first node;

a plurality of first capacitors connected between said each signal terminal and ground, respectively;

a plurality of second capacitors connected between said each signal terminal and a second node, respectively; and an inductor and a resistor serially connected between said ground and said first node.

2. A three-terminal equivalent circuit of a package ground terminal paddle comprising:

an inductor and a resistor connected between a first signal terminal and first node;

an inductor and a resistor connected between a second signal terminal and said first node;

an inductor and a resistor connected between a third signal terminal and said first node;

a capacitor connected between said first signal terminal and a second node;

a capacitor connected between said second terminal and said second node;

a capacitor connected between said third signal terminal and said second node;

a capacitor connected between said first signal terminal and a ground terminal;

a capacitor connected between said second signal terminal and said ground terminal;

a capacitor connected between said third signal terminal and said ground terminal; and an inductor and a resistor connected between said ground terminal and said first node.

3. A method for designing an equivalent circuit of a package ground terminal paddle for a monolithic microwave integrated circuit, the equivalent circuit representing a parasitic component between terminals of the package ground terminal paddle, comprising the steps of:

taking the impedance component output from each of the terminals of the package ground terminal paddle to a ground as one common impedance component;

grounding the common impedance component by connecting the common impedance component between a first node and the ground; and connecting corresponding predetermined impedance components between each of the terminals and the first node.

4. The method of claim 3, wherein the step of connecting predetermined impedance components includes selecting a value of each of the said predetermined impedance components to represent a worst case impedance between two neighboring ones of the terminals that are positioned farthest away from a ground hole on the package ground terminal paddle.

* * * * *